(12) United States Patent
Chen et al.

(10) Patent No.: US 11,705,035 B2
(45) Date of Patent: Jul. 18, 2023

(54) DISPLAY PANEL AND DISPLAY DEVICE HAVING GATE DRIVE CIRCUIT

(71) Applicant: Xiamen Tianma Micro-Electronics Co., Ltd., Xiamen (CN)

(72) Inventors: Huiying Chen, Xiamen (CN); Changzhi Wu, Xiamen (CN); Ying Sun, Xiamen (CN); Yumin Xu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 17/256,631

(22) PCT Filed: Feb. 12, 2020

(86) PCT No.: PCT/CN2020/074794
§ 371 (c)(1),
(2) Date: Dec. 28, 2020

(87) PCT Pub. No.: WO2021/103315
PCT Pub. Date: Jun. 3, 2021

(65) Prior Publication Data
US 2022/0284842 A1 Sep. 8, 2022

(30) Foreign Application Priority Data
Nov. 29, 2019 (CN) .......................... 201911207500.1

(51) Int. Cl.
*G09G 3/20* (2006.01)
*G09G 3/36* (2006.01)
(Continued)

(52) U.S. Cl.
CPC ......... *G09G 3/20* (2013.01); *G02F 1/136286* (2013.01); *G09G 3/3266* (2013.01);
(Continued)

(58) Field of Classification Search
CPC ...... G09G 3/20; G09G 3/3266; G09G 3/3648; G09G 3/3674; G09G 3/3677;
(Continued)

(56) References Cited

U.S. PATENT DOCUMENTS

| 2007/0071158 A1 | 3/2007 | Wei et al. | |
| 2009/0033642 A1* | 2/2009 | Chiang | G11C 19/28 377/67 |
| 2018/0190204 A1* | 7/2018 | Shin | G09G 3/3677 |
| 2020/0160769 A1* | 5/2020 | Fu | G09G 3/20 |

FOREIGN PATENT DOCUMENTS

| CN | 101738796 A | 6/2010 | |
| CN | 102087844 A * | 6/2011 | G09G 3/36 |

(Continued)

OTHER PUBLICATIONS

International Search Report, dated Mar. 3, 2021.

*Primary Examiner* — Adam J Snyder
(74) *Attorney, Agent, or Firm* — Alston & Bird LLP

(57) ABSTRACT

Provided are a display panel and a display device. The display panel includes multiple cascaded gate drive units. Each gate drive unit includes a shift register unit and an inverted unit. The inverted unit is electrically connected to the shift register unit. A scan output terminal of the shift register unit is electrically connected to one scan line. An inverted scan output terminal of the inverted unit is electrically connected to one inverted scan line. The scan output terminal of the shift register unit outputs a first effective pulse signal. The inverted scan output terminal of the inverted unit outputs a second effective pulse signal. A time period corresponding to the first effective pulse signal at least partially overlaps a time period corresponding to the second effective pulse signal, and the type of the first effective pulse signal is opposite to the type of the second effective pulse signal.

14 Claims, 11 Drawing Sheets

(51) Int. Cl.
G09G 3/3266 (2016.01)
G11C 19/28 (2006.01)
G02F 1/1362 (2006.01)
H10K 59/131 (2023.01)

(52) U.S. Cl.
CPC ........ G09G 3/3648 (2013.01); G09G 3/3674 (2013.01); G09G 3/3677 (2013.01); G09G 2230/00 (2013.01); G09G 2300/0408 (2013.01); G09G 2310/0267 (2013.01); G09G 2310/0283 (2013.01); G09G 2310/0286 (2013.01); G09G 2310/0291 (2013.01); G09G 2330/06 (2013.01); G09G 2380/10 (2013.01); G11C 19/28 (2013.01); H10K 59/131 (2023.02)

(58) Field of Classification Search
CPC ....... G09G 2230/00; G09G 2300/0408; G09G 2310/0267; G09G 2310/0283; G09G 2310/0286; G09G 2310/0291; G09G 2330/06; G09G 2380/10; G02F 1/136286; G11C 19/28; H01L 27/3276
See application file for complete search history.

(56) References Cited

FOREIGN PATENT DOCUMENTS

| | | | | | |
|---|---|---|---|---|---|
| CN | 203397671 U | | 1/2014 | | |
| CN | 104392687 A | | 3/2015 | | |
| CN | 104867467 A | | 8/2015 | | |
| CN | 205177380 U | | 4/2016 | | |
| CN | 106057131 A | | 10/2016 | | |
| CN | 104361853 B | * | 2/2017 | ............... | G09G 3/20 |
| CN | 106486079 A | | 3/2017 | | |
| CN | 107527925 A | | 12/2017 | | |
| CN | 107767809 A | | 3/2018 | | |
| CN | 107767809 A | * | 3/2018 | ............... | G09G 3/20 |
| CN | 108346405 A | | 7/2018 | | |
| CN | 108399882 A | * | 8/2018 | ......... | G06K 9/00013 |
| CN | 108648683 A | | 10/2018 | | |
| CN | 108806581 A | * | 11/2018 | ............... | G09G 3/20 |
| CN | 108873530 A | | 11/2018 | | |
| CN | 110111831 A | | 8/2019 | | |
| CN | 110313028 A | | 10/2019 | | |
| CN | 110751929 A | | 2/2020 | | |

* cited by examiner

DISPLAY PANEL AND DISPLAY DEVICE HAVING GATE DRIVE CIRCUIT

CROSS-REFERENCE TO RELATED APPLICATIONS

This is a National Stage Application filed under 35 U.S.C. 371 based on International Patent Application No. PCT/CN2020/074794, filed on Feb. 12, 2020, which claims priority to Chinese Patent Application No. 201911207500.1, filed on Nov. 29, 2019, both are entitled "DISPLAY PANEL AND DISPLAY DEVICE", the disclosures of both of which are incorporated herein by reference in their entireties.

TECHNICAL FIELD

Embodiments of the present application relate to the field of display technologies and, for example, to a display panel and a display device.

BACKGROUND

With the development of display technologies, liquid crystal display (LCD) panels and organic light emitting diode (OLED) display panels have become two mainstream display panels in the display field, and are widely applied in computers, mobile phones, wearable devices and vehicle-mounted devices, etc.

Each of the LCD and the OLED includes a display area and a non-display area surrounding the display area. The display area includes multiple rows and multiple columns of subpixels and multiple scan lines. Each scan line is connected to one row of subpixels. The non-display area includes a gate drive circuit. The gate drive circuit is used for generating a scan signal and transmit the scan signal to the scan lines to control the subpixels in the display area to light up row by row. However, the scan signal generated by the gate drive circuit has a fixed frequency. Therefore, the scan signal may generate electromagnetic interference (EMI). In the case where the EMI radiates from a display panel, it may interfere with the normal operation of other electronic devices.

SUMMARY

The present application provides a display panel and a display device, to reduce electromagnetic interference radiating from the display panel to the periphery.

An embodiment of the present application provides a display panel. The display panel includes a gate drive circuit, multiple scan lines and multiple inverted scan lines. The inverted scan lines are disposed in parallel with the scan lines.

The gate drive circuit includes multiple cascaded gate drive units. Each gate drive unit includes a shift register unit and an inverted unit.

In the same gate drive unit, the inverted unit is electrically connected to the shift register unit, a scan output terminal of the shift register unit is electrically connected to one scan line, and an inverted scan output terminal of the inverted unit is electrically connected to one inverted scan line.

The scan output terminal of the shift register unit outputs a first effective pulse signal, and the inverted scan output terminal of the inverted unit outputs a second effective pulse signal. A time period corresponding to the first effective pulse signal at least partially overlaps a time period corresponding to the second effective pulse signal, and a level state of the first effective pulse signal is opposite to a level state of the second effective pulse signal.

An embodiment of the present application further provides a display device. The display device includes the display panel described in any one of embodiments of the present application.

DETAILED DESCRIPTION

Figure 1:
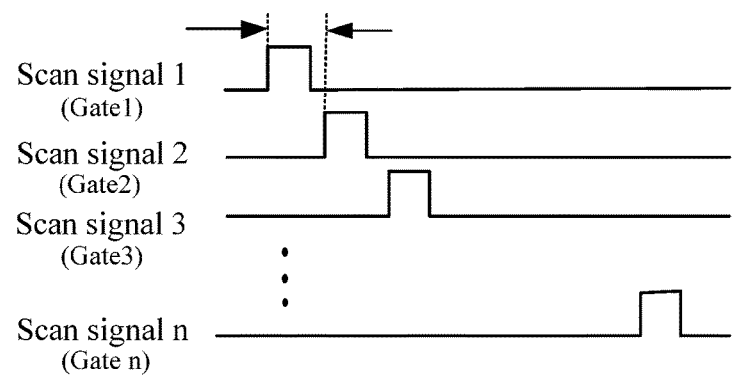
FIG. 1 is a timing diagram of scan signals of a display panel according to the related art.

The present application will be described below in conjunction with the drawings and embodiments. The embodiments set forth below are intended to explain the present application and not to limit the present application. For ease of description, only part, not all, of structures related to the present application are illustrated in the drawings.

Figure 2:
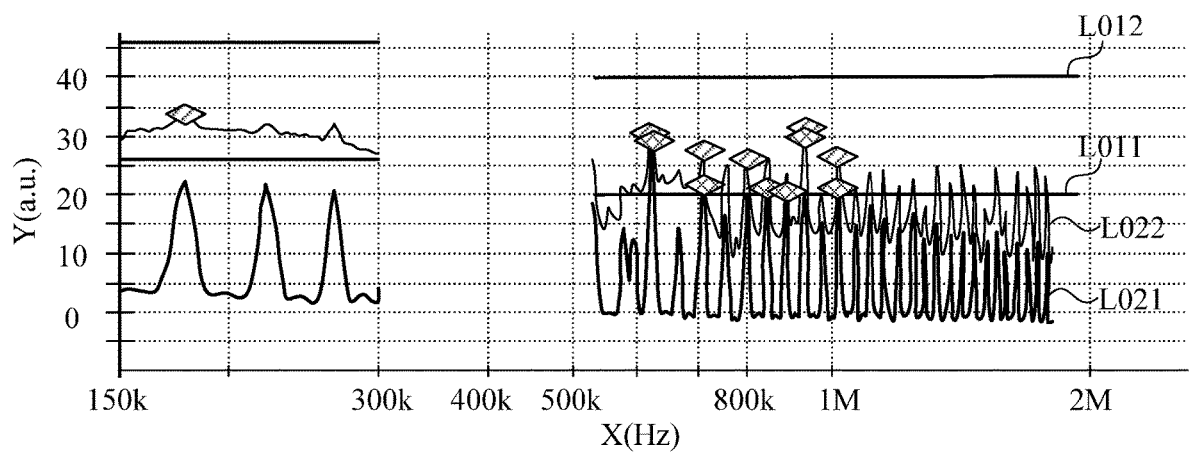
FIG. 2 is a schematic diagram of an effect of electromagnetic interference generated by the display panel in FIG. 1.

A display panel includes a display area and a non-display area. In the display area, multiple scan lines and multiple data lines intersect to define multiple subpixel areas. A subpixel unit is disposed within each subpixel area. In the non-display area, a gate drive circuit is disposed. The gate drive circuit includes multiple cascaded shift registers. In adjacent two stages of shift registers, a secondary trigger signal output terminal of the upper-stage shift register is electrically connected to a trigger signal input terminal of the lower-stage shift register. An output terminal of each stage of shift register is connected to one scan line so that each scan line may be driven one by one, and thus a data signal may be transmitted row by row to each subpixel unit in the display panel. Exemplarily, FIG. 1 is a timing diagram of scan signals of a display panel according to the related art. FIG. 2 is a schematic diagram of the effect of electromagnetic interference generated by the display panel in FIG. 1. Referring to FIG. 1 and FIG. 2, in the related art, scan signals (gate1, gate2, gate3, . . . , gate n in FIG. 1) perform scanning stage by stage in a row-by-row (also referred to as "stage-by-stage") scanning manner. Since the scan frequency is fixed, energy peaks occur at multiple fixed frequency positions, that is, the energy peaks occur periodically. The relatively large energy at the energy peaks radiates outward, which easily causes other electronic products to fail to operate normally. Exemplarily, an EMI test result is shown in FIG. 2. The abscissa X denotes the frequency in hertz (Hz), and the ordinate Y denotes the intensity of the radiant energy, which may be understood as a decibel (DB) value (that is, a count value) in absolute unit (a.u.). That is, the EMI test result is obtained by using a pure counting method, where L011 and L012 denote the average value and maximum value of the same specification requirement limitation of a vehicle, respectively, and L021 and L022 denote the average value curve and maximum value curve of the radiant energy of the obtained EMI at different frequencies, respectively. It can be seen from FIG. 2 that the energy peaks occur at positions where the scan frequency is multiplied. In this manner, the energy at the energy peaks radiates to the periphery of the display panel, which may affect the normal operation of other electronic products around the display panel.

Embodiments of the present application provide a display panel and a display device. The display panel includes a gate drive circuit, multiple scan lines and multiple inverted scan lines. The inverted scan lines are disposed in parallel with the scan lines.

The gate drive circuit includes multiple cascaded gate drive units. Each gate drive unit includes a shift register unit and an inverted unit.

In the same gate drive unit, the inverted unit is electrically connected to the shift register unit, a scan output terminal of the shift register unit is electrically connected to one scan line, and an inverted scan output terminal of the inverted unit is electrically connected to one inverted scan line.

The scan output terminal of the shift register unit outputs a first effective pulse signal, and the inverted scan output terminal of the inverted unit outputs a second effective pulse signal. A time period corresponding to the first effective pulse signal at least partially overlaps a time period corresponding to the second effective pulse signal, and a level state of the first effective pulse signal is opposite to a level state of the second effective pulse signal.

The technical schemes in the embodiments of the present application will be described below in conjunction with drawings in the embodiments of the present application.

Figure 3:
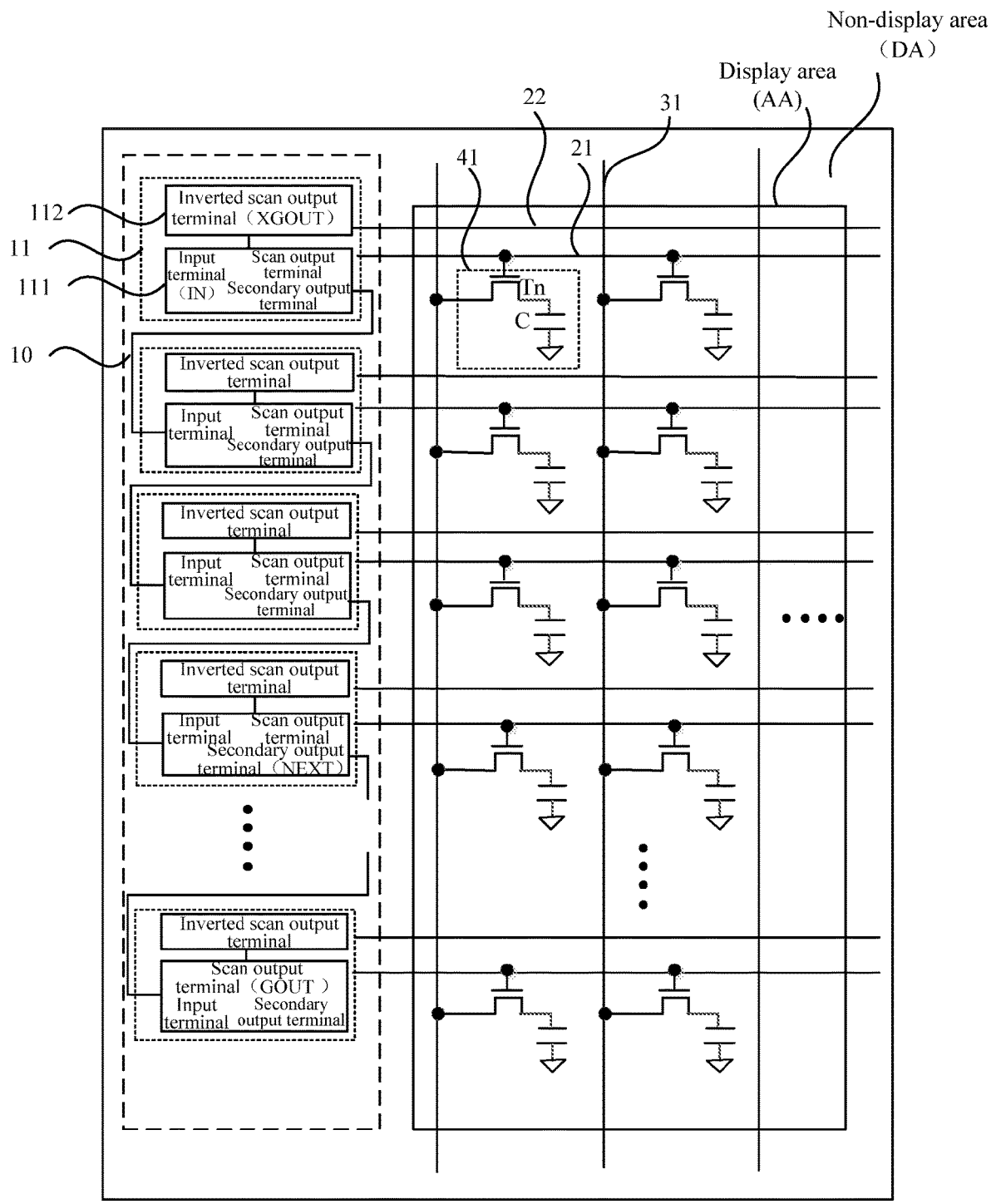
FIG. 3 is a structural diagram of a display panel according to an embodiment of the present application.
Figure 4:
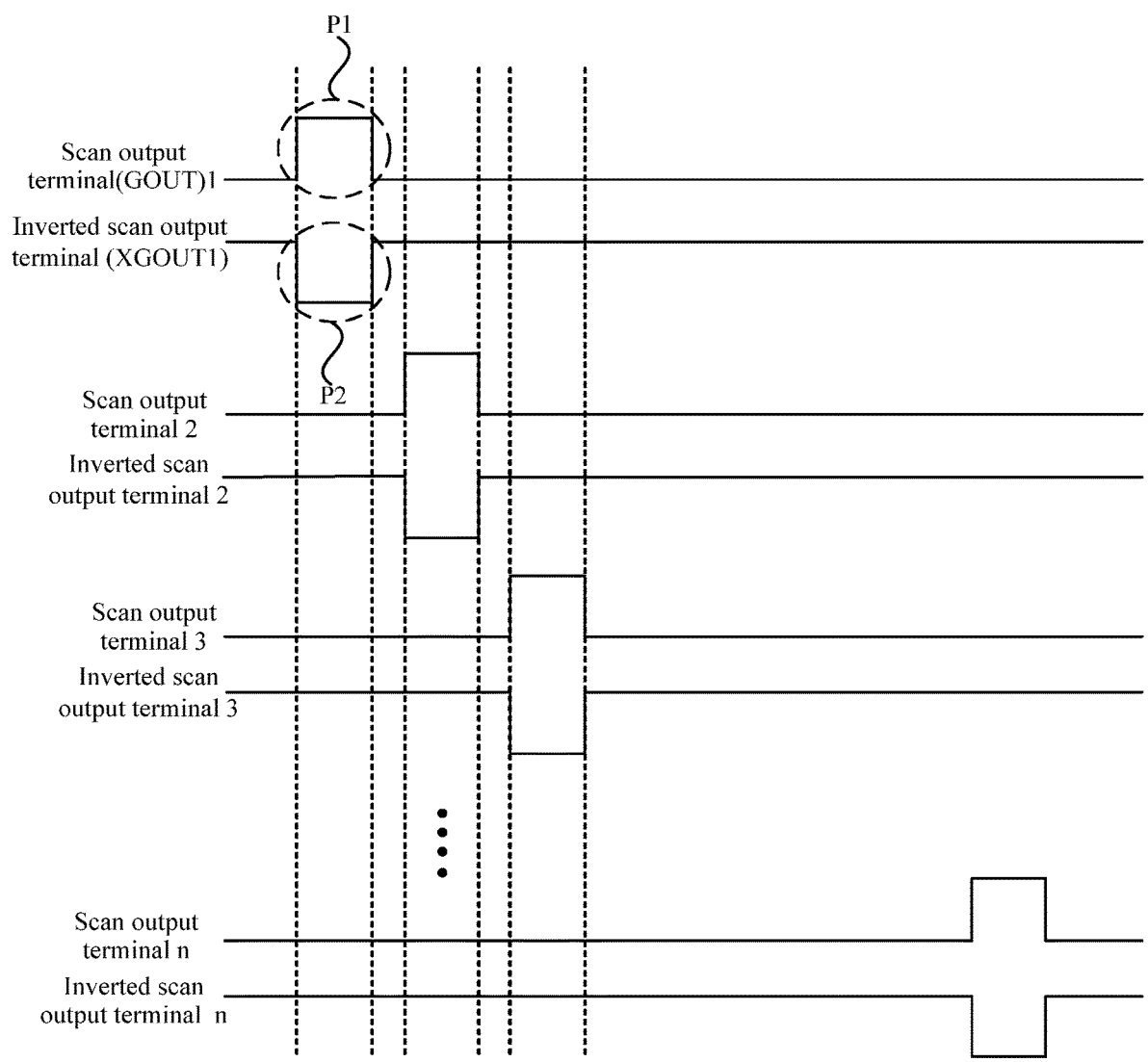
FIG. 4 is a timing diagram of scan signals and inverted signals of the display panel in FIG. 3.

FIG. 3 is a structural diagram of a display panel according to an embodiment of the present application. FIG. 4 is a timing diagram of scan signals and inverted signals of the display panel in FIG. 3. Referring to FIG. 3, this display panel includes a gate drive circuit 10, multiple scan lines 21 and multiple inverted scan lines 22. The inverted scan lines 22 are disposed in parallel with the scan lines 21. The gate drive circuit 10 includes multiple cascaded gate drive units 11. Each gate drive unit 11 includes a shift register unit 111 and an inverted unit 112. In the same gate drive unit 11, the inverted unit 112 is electrically connected to the shift register unit 111, a scan output terminal GOUT of the shift register unit 111 is electrically connected to one scan line 21, and an inverted scan output terminal XGOUT of the inverted unit 112 is electrically connected to one inverted scan line 22. The scan output terminal GOUT of the shift register unit 111 outputs a first effective pulse signal P1, and the inverted scan output terminal XGOUT of the inverted unit 112 outputs a second effective pulse signal P2. A time period corresponding to the first effective pulse signal P1 at least partially overlaps a time period corresponding to the second effective pulse signal P2, and the type of the first effective pulse signal P1 is opposite to the type of the second effective pulse signal P2.

The display panel may be an LCD panel, an OLED display panel or other types of display panels, which is not limited in the embodiment of the present application. Exemplarily, FIG. 3 shows that the display panel is an LCD panel.

Exemplarily, referring to FIG. 3, the display panel includes a display area AA and a non-display area DA surrounding the display area AA. In the display area AA, the display panel is provided with multiple scan lines 21 and multiple data lines 31. The scan lines 21 and the data lines 31 are intersected to define multiple subpixel areas. A subpixel unit is disposed within each subpixel area. Each subpixel unit includes a subpixel drive circuit 41. In the non-display area DA, the display panel is provided with a gate drive circuit 10. The gate drive circuit 10 includes multiple cascaded gate drive units 11. Each gate drive unit 11 includes a shift register unit 111 and an inverted unit 112. The shift register units 111 in the multiple gate drive units 11 are connected in cascade, that is, in two stages of shift register units 111, a secondary output terminal NEXT in the upper-stage shift register unit 111 is electrically connected to an input terminal IN in the lower-stage shift register unit 111. In an embodiment, since multiple implementations of the shift register unit 111 and the inverted unit 112 exist, in the case where the implementations of the shift register unit 111 are different, a connection relationship between the inverted unit 112 and the shift register unit 111 changes accordingly. Therefore, the connection relationship between the inverted unit 112 and the shift register unit 111 will not be described here, and the connection relationship between the inverted unit 112 and the shift register unit 111 will be described below in conjunction with the circuit of the shift register unit 111.

In an embodiment, the scan output terminal GOUT of the shift register unit 111 provides a scan signal for the scan line 21. The scan signal includes a first effective pulse signal P1. The first effective pulse signal P1 may trigger a data signal to transmit to the subpixel unit for charging. The inverted scan output terminal XGOUT of the inverted unit 112 provides an inverted scan signal for the inverted scan line 22. The inverted scan signal includes a second effective pulse signal P2. Exemplarily, if a switch transistor in a pixel circuit is an N-type transistor, then after the scan signal transitions from a low-level state to a high-level state, the scan signal may trigger the data signal to transmit to the subpixel unit for charging, that is, the type of the first effective pulse signal P1 is a positive pulse, and correspondingly, the type of the second effective pulse signal P2 is a negative pulse, as shown in FIG. 4. If the switch transistor in the pixel circuit is a P-type transistor, then after the scan signal transitions from a high level to a low level, the scan signal may trigger the data signal to transmit to the subpixel unit for charging, that is, the type of the first effective pulse signal P1 is a negative pulse, and correspondingly, the type of the second effective pulse signal P2 is a positive pulse. The type of the first effective pulse signal P1 and the type of the second effective pulse signal P2 may be set according to actual conditions and are not limited herein. However, for ease of description with examples, the case where the first effective pulse signal P1 is a positive pulse and the second effective pulse signal P2 is a negative pulse is used as an example for description below.

In an embodiment, the case where the time period corresponding to the first effective pulse signal P1 at least partially overlaps the time period corresponding to the second effective pulse signal P2 includes multiple cases. Exemplarily, as shown in FIG. 4, the time period corresponding to the first effective pulse signal P1 completely overlaps the time period corresponding to the second effective pulse signal P2. Alternatively, the time period corresponding to the first effective pulse signal P1 partially overlaps the time period corresponding to the second effective pulse signal P2, and the start time of the first effective pulse signal P1 is earlier than the start time of the second effective pulse signal P2. Alternatively, the time period corresponding to the first effective pulse signal P1 partially overlaps the time period corresponding to the second effective pulse signal P2, and the start time of the first effective pulse signal P1 is later than the start time of the second effective pulse signal P2. No limitation is made in the embodiment of the present application, and settings can be performed according to actual conditions.

In the display panel provided by the embodiment of the present application, the gate drive unit 11 includes the shift register unit 111 and the inverted unit 112, where the scan output terminal GOUT of the shift register unit 111 outputs the scan signal, and the scan signal includes the first effective pulse signal P1; and the inverted scan output terminal XGOUT of the inverted unit 112 outputs the inverted scan signal, and the inverted scan signal includes the second effective pulse signal P2. Since the type of the first effective pulse signal P1 is opposite to the type of the second effective pulse signal P2, the phase of the electromagnetic radiation generated by the scan signal is opposite to the phase of the electromagnetic radiation generated by the inverted scan signal. Moreover, since the time period corresponding to the first effective pulse signal P1 at least partially overlaps the time period corresponding to the second effective pulse signal P2, the electromagnetic radiation generated by the scan signal can be at least partially canceled by the electromagnetic radiation generated by the inverted scan signal through vector addition, that is, the electromagnetic interference generated by the scan signal is reduced, so that the problem that the interference energy radiates to the periphery to cause interference to other electronic products is avoided, and it is beneficial to the normal operation of other electronic products around the display panel.

As described above, the case where the time period corresponding to the first effective pulse signal P1 at least partially overlaps the time period corresponding to the second effective pulse signal P2 includes multiple cases. These cases will be described below separately.

With continued reference to FIG. 4, optionally, the time period corresponding to the first effective pulse signal P1 completely overlaps the time period corresponding to the second effective pulse signal P2. The advantage of this setting is that, theoretically, the electromagnetic radiation generated by the scan signal can be completely canceled by the electromagnetic radiation generated by the inverted scan signal through vector addition, that is, the electromagnetic interference generated by the scan signal can be completely removed. In this manner, it can be improved to a relatively great extent that the interference energy generated by the scan signal radiates to the periphery to cause interference to other electronic products.

Figure 5:
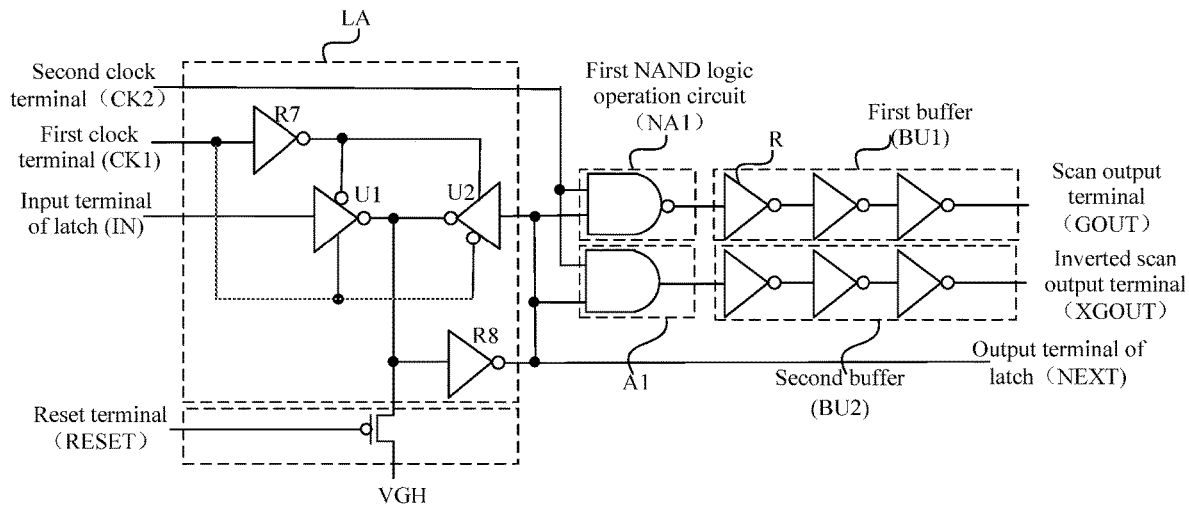
FIG. 5 is a schematic diagram of circuit elements of a gate drive unit according to an embodiment of the present application.
Figure 6:
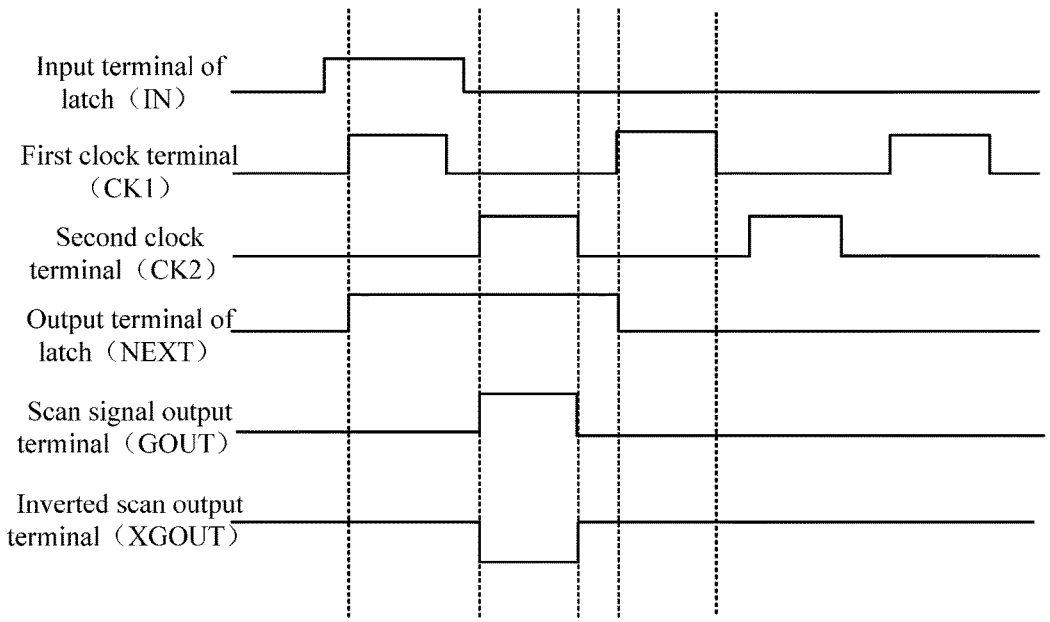
FIG. 6 is a timing diagram of the gate drive unit in FIG. 5.

In an embodiment, if it needs to be implemented that the time period corresponding to the first effective pulse signal completely overlaps the time period corresponding to the second effective pulse signal, there are multiple implementations of the gate drive units 11. Examples will be described below. FIG. 5 is a schematic diagram of circuit elements of a gate drive unit according to an embodiment of the present application. FIG. 6 is a timing diagram of the gate drive unit in FIG. 5. Referring to FIG. 5, optionally, the shift register unit 111 includes a latch LA, a first NAND logic operation circuit NA1 and a first buffer BU1. A clock input terminal of the latch LA is electrically connected to a first clock terminal CK1 of the display panel. An input terminal IN of the latch LA is electrically connected to an output terminal NEXT of the latch LA in the upper-stage shift register unit 111. A first input terminal of the first NAND logic operation circuit NA1 is electrically connected to the output terminal NEXT of the latch LA. A second input terminal of the first NAND logic operation circuit NA1 is electrically connected to a second clock terminal CK2 of the display panel. An output terminal of the first NAND logic operation circuit NA1 is electrically connected to an input terminal of the first buffer BU1. An output terminal of the first buffer BU1 is connected to one scan line 21. The inverted unit 112 includes a first AND logic operation circuit A1 and a second buffer BU2. A first input terminal of the first AND logic operation circuit A1 is electrically connected to the output terminal of the latch LA. A second input terminal of the first AND logic operation circuit A1 is electrically connected to the second clock terminal CK2 of the display panel. An output terminal of the first AND logic operation circuit A1 is electrically connected to an input terminal of the second buffer BU2. An output terminal of the second buffer BU2 is connected to one inverted scan line 22. The first buffer BU1 and the second buffer BU2 each includes m inverters R connected in series, where m is a positive integer.

In an embodiment, the latch LA is configured to transmit and latch a signal input by the input terminal IN of the latch LA. Multiple implementations exist. Exemplarily, FIG. 5 shows that the latch LA includes a first clock inverter U1, a second clock inverter U2, a seventh inverter R7 and an eighth inverter R8. A second control terminal of the first clock inverter U1, a first control terminal of the second clock inverter U2 and an input terminal of the seventh inverter R are electrically connected to the first clock terminal CK1 of the display panel. An output terminal of the seventh inverter R is electrically connected to a first control terminal of the first clock inverter U1 and a second control terminal of the second clock inverter U2, respectively. An input terminal of the first clock inverter U1 is electrically connected to the output terminal NEXT of the latch LA in the upper-stage shift register unit 111. An output terminal of the first clock inverter U1 is electrically connected to an output terminal of the second clock inverter U2 and an input terminal of the eighth inverter R8, respectively. An output terminal of the eighth inverter R8 is electrically connected to an input terminal of the second clock inverter U2.

In an embodiment, multiple implementations of the first NAND logic operation circuit NA1 exist. Exemplarily, FIG. 5 shows that the first NAND logic operation circuit NA1 includes a NAND gate, which does not constitute a limitation to the first NAND logic operation circuit NA1. In other implementations, the first NAND logic operation circuit NA1 may also be formed by AND gates and NOT gates arranged in series, which is not limited in the present application, and can be set according to actual conditions.

In an embodiment, multiple implementations of the first AND logic operation circuit A1 exist. Exemplarily, FIG. 5 shows that the first AND logic operation circuit A1 includes an AND gate, which does not constitute a limitation to the present application, and can be set according to actual conditions.

In an embodiment, the first buffer BU1 is configured to perform voltage stabilization processing on a signal input by the input terminal of the first buffer BU1, and the same thing goes for the second buffer BU2. Multiple implementations of the first buffer BU1 and the second buffer BU2 exist. Exemplarily, FIG. 5 shows that the first buffer BU1 and the second buffer BU2 each includes three inverters R connected in series, which does not constitute a limitation to the present application. The number of inverters R in the first buffer BU1 and the number of inverters R in the second buffer BU2 may be set according to actual conditions.

In an embodiment, for the first-stage gate drive unit 11, there is no upper-stage gate drive unit 11 for the first-stage gate drive unit 11. Therefore, for the shift register unit 111 in the first-stage gate drive unit 11, the input terminal IN of the latch LA is electrically connected to an enable input terminal of the display panel. Furthermore, in two adjacent stages of gate drive units 11, if in the upper-stage shift register unit 111, the clock input terminal IN of the latch LA is electrically connected to the first clock terminal CK1 of the display panel and the second input terminal of the first NAND logic operation circuit NA1 is electrically connected to the second clock terminal CK2 of the display panel, then in the lower-stage shift register unit 111, the clock input terminal IN of the latch LA is electrically connected to the second clock terminal CK2 of the display panel and the second input terminal of the first NAND logic operation circuit NA1 is electrically connected to the first clock terminal CK1 of the display panel, and vice versa, which will not be repeated herein.

Referring to FIG. 5 and FIG. 6, the operating process of the gate drive unit 11 is as follows: when the first clock terminal CK1 of the display panel outputs a high level, the first clock inverter U1 is equivalent to one inverter R. In this case, the signal output by the output terminal of the first clock inverter U1 is the inverted signal of the signal input by the input terminal of the first clock inverter U1; the second clock inverter U2 is inoperative, the output terminal of the second clock inverter U2 is in a floating state, and the signal output by the output terminal NEXT of the latch LA is the signal input by the input terminal IN of the latch LA. When the first clock terminal CK1 of the display panel outputs a low level, the first clock inverter U1 is inoperative and the output terminal of the first clock inverter U1 is in a floating state; the second clock inverter U2 is equivalent to one inverter R. In this case, the signal output by the output terminal of the second clock inverter U2 is the signal obtained after two inversions of the signal of the output terminal NEXT of the latch LA, that is, the signal output by the output terminal of the second clock inverter U2 is the same as the signal of the output terminal NEXT of the latch LA. After the signal output by the output terminal NEXT of the latch LA and the signal of the second clock terminal CK2 of the display panel are subjected to an NAND operation, these two signals are subjected to voltage stabilization performed by the first buffer BU1 and are output after three inversions, then the scan signal is obtained. After the signal output by the output terminal of the latch LA and the signal of the second clock terminal CK2 of the display panel are subjected to an AND operation, these two signals are subjected to voltage stabilization performed by the second buffer BU2 and are output after three inversions, then the inverted scan signal is obtained. In an embodiment, in the case where the clock input terminal IN of the latch LA is electrically connected to the second clock terminal CK2 of the display panel and the second input terminal of the first NAND logic operation circuit NA1 is electrically connected to the first clock terminal CK1 of the display panel, the operating process of the gate drive unit is similar to the preceding operating process, which may be understood according to the preceding description and will not be repeated herein.

In an embodiment, since the number of inverters R in the first buffer BU1 and the number of inverters R in the second buffer BU2 are the same, the action that the scan signal transitions from the low-level state to the high-level state synchronizes with the action that the inverted scan signal transitions from the high-level state to the low-level state. Similarly, the action that the scan signal transitions from the high-level state to the low-level state synchronizes with the action that the inverted scan signal transitions from the low-level state to the high-level state. In other words, the time period corresponding to the first effective pulse signal completely overlaps the time period corresponding to the second effective pulse signal.

Optionally, the time period corresponding to the first effective pulse signal partially overlaps the time period corresponding to the second effective pulse signal, and the start time of the first effective pulse signal is earlier than the start time of the second effective pulse signal.

Figure 7:
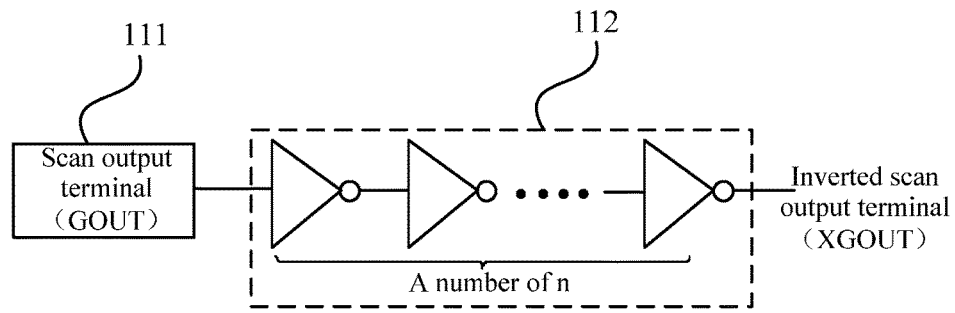
FIG. 7 is a structural diagram of a gate drive unit according to an embodiment of the present application.
Figure 8:
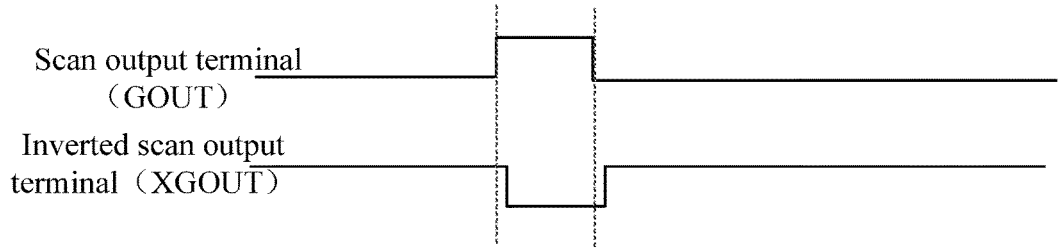
FIG. 8 is a timing diagram of the gate drive unit in FIG. 7.

Multiple implementations of the gate drive unit 11 exist. Examples will be described below. FIG. 7 is a structural diagram of a gate drive unit according to an embodiment of the present application. FIG. 8 is a timing diagram of the gate drive unit in FIG. 7. Referring to FIG. 7, optionally, the input terminal of the inverted unit 112 is electrically connected to the scan signal output terminal GOUT of the shift register unit 111; the inverted unit 112 includes n inverters R connected in series, where n is a positive and odd integer.

In an embodiment, the inverted unit 112 includes n inverters R connected in series, then the signal output by the output terminal of the inverted unit 112 is the signal obtained after odd times of inversions of the signal of the input terminal of the inverted unit 112. That is, the signal output by the output terminal of the inverted unit 112 is opposite to the signal of the input terminal of the inverted unit 112. In other words, the level state of the scan signal is opposite to the level state of the inverted scan signal, such that the type of the first effective pulse signal is opposite to the type of the second effective pulse signal. In an embodiment, the inverted scan signal may be output after the scan signal passes through the inverted unit 112. Therefore, the inverted scan signal has a delay relative to the scan signal, that is, the first effective pulse signal partially overlaps the second effective pulse signal, and the start time of the first effective pulse signal is earlier than the start time of the second effective pulse signal. The value of n can be set according to actual conditions and is not limited herein.

Optionally, the inverted unit 112 includes one inverter R. In this manner, the scan signal needs to pass through only one inverter R, and then the inverted scan signal can be obtained. That is, between the start time of the first effective pulse signal and the start time of the second effective pulse signal, there is a time delay introduced by the case where the scan signal passes through only one inverter R. Therefore, it can be ensured that the overlap ratio of the first effective pulse signal and the second effective pulse signal is relatively large, and thus it can be ensured that the canceled part of the electromagnetic radiation generated by the scan signal is sufficiently large.

In an embodiment, multiple implementations of the shift register unit 111 in the gate drive unit 11 exist. Examples will be described below.

Figure 9:
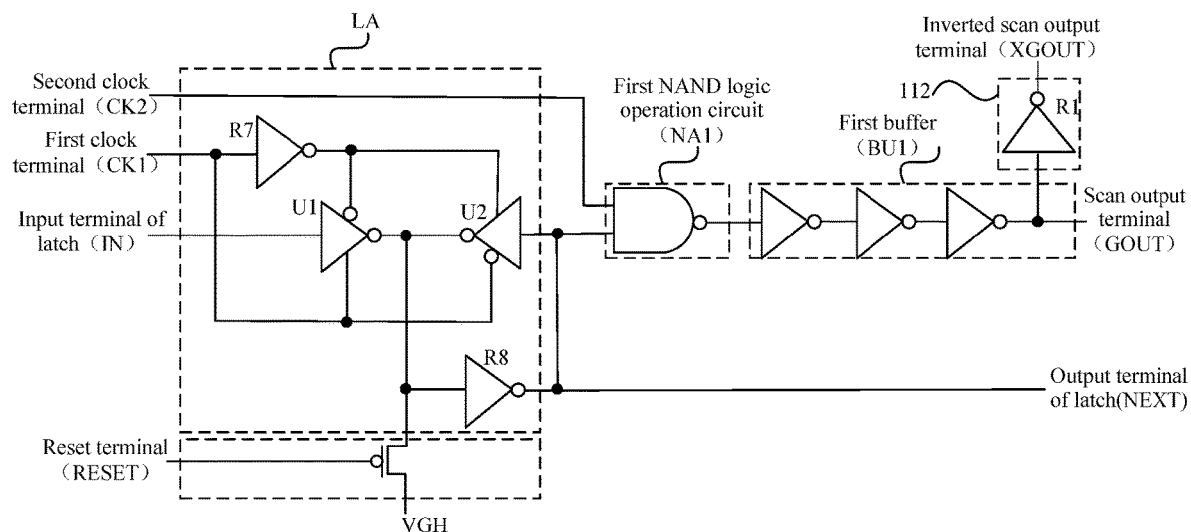
FIG. 9 is a schematic diagram of circuit elements of another gate drive unit according to an embodiment of the present application.

Exemplarily, FIG. 9 is a schematic diagram of circuit elements of another gate drive unit according to an embodiment of the present application. Referring to FIG. 9, optionally, the shift register unit 111 includes the latch LA, the first NAND logic operation circuit NA1 and the first buffer BU1. The clock input terminal of the latch LA is electrically connected to the first clock terminal CK1 of the display panel. The input terminal IN of the latch LA is electrically connected to the output terminal NEXT of the latch LA in the upper-stage shift register unit 111. The first input terminal of the first NAND logic operation circuit NA1 is electrically connected to the output terminal NEXT of the latch LA. The second input terminal of the first NAND logic operation circuit NA1 is electrically connected to the second clock terminal CK2 of the display panel. The output terminal of the first NAND logic operation circuit NA1 is electrically connected to the input terminal of the first buffer BU1. The output terminal of the first buffer BU1 is connected to one scan line 21. The first buffer BU1 includes m inverters R connected in series, where m is a positive integer; the inverted unit 112 includes a first inverter R1, the input terminal of the first inverter R1 is electrically connected to the output terminal of the first buffer BU1, and the output terminal of the first inverter R1 is connected to one inverted scan line 22.

In an embodiment, FIG. 9 exemplarily shows that the first buffer BU1 includes three inverters R connected in series, which does not constitute a limitation to the present application. The value of m can be set according to actual conditions and is not limited herein.

In an embodiment, the shift register unit 111 in FIG. 9 is the same as the shift register unit 111 in FIG. 5, and the operating process of the shift register unit 111 will not be repeated herein. After the scan output terminal GOUT of the shift register unit 111 outputs the scan signal, the scan signal is input to the input terminal of the inverted unit 112. The signal output by the inverted scan output terminal XGOUT of the inverted unit 112 is the signal obtained after one inversion of the signal of the input terminal of the inverted unit 112, that is, the signal output by the inverted scan output terminal XGOUT of the inverted unit 112 is opposite to the signal of the input terminal of the inverted unit 112, therefore, the level state of the scan signal is opposite to the level state of the inverted scan signal, and the time delay between the first effective pulse signal and the second effective pulse signal is the time required to pass one inverter R.

In an embodiment, compared to the gate drive unit 11 shown in FIG. 5, although the first effective pulse signal output by the gate drive unit 11 shown in FIG. 9 partially overlaps the second effective pulse signal output by the gate drive unit 11 shown in FIG. 9, causing it impossible to completely eliminate the electromagnetic interference generated by the scan signal, the inverted unit 112 includes only a first inverter R1, has relatively few electronic elements and occupies a relatively small area, thus it is beneficial to achieve a narrow frame.

Figure 10:
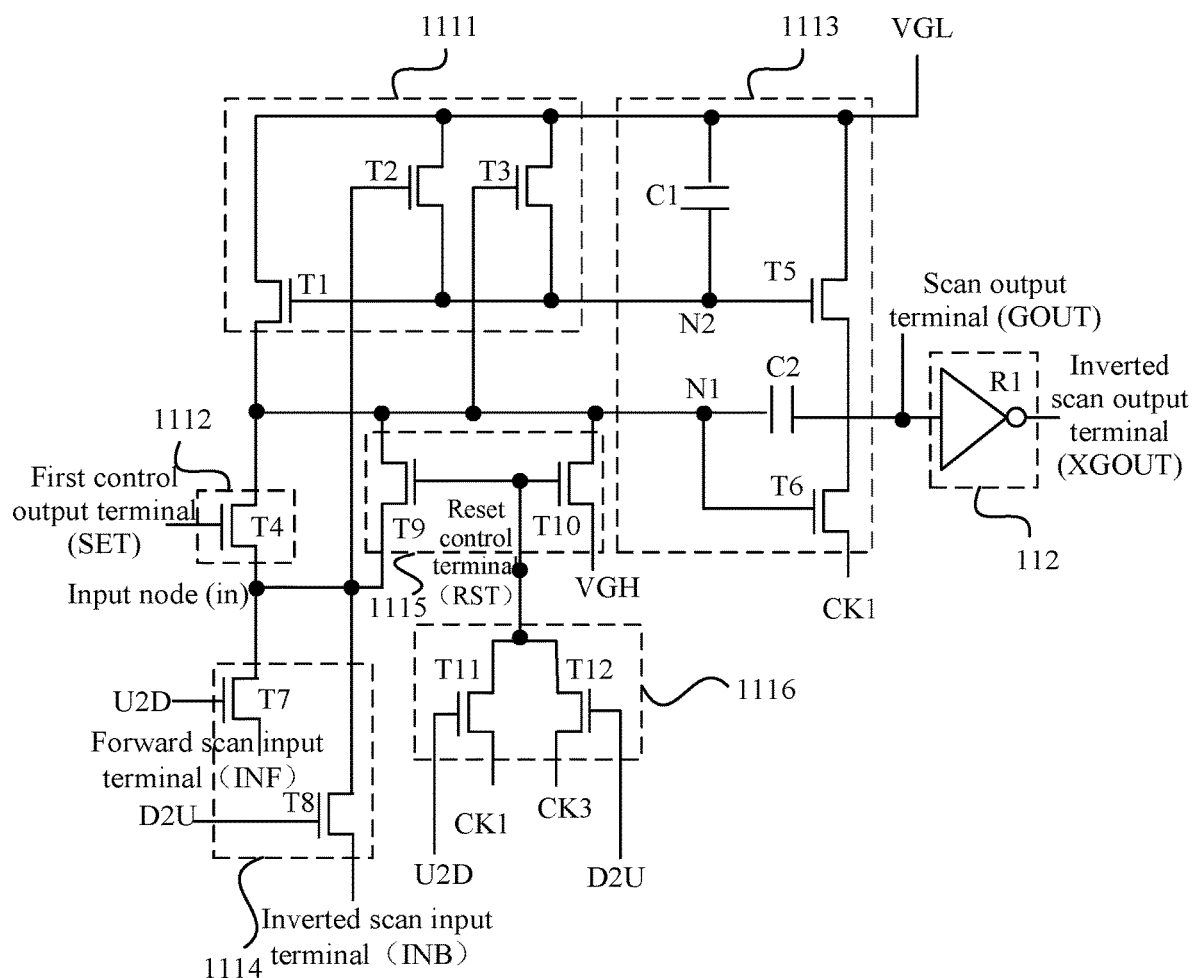
FIG. 10 is a schematic diagram of circuit elements of another gate drive unit according to an embodiment of the present application.
Figure 11:
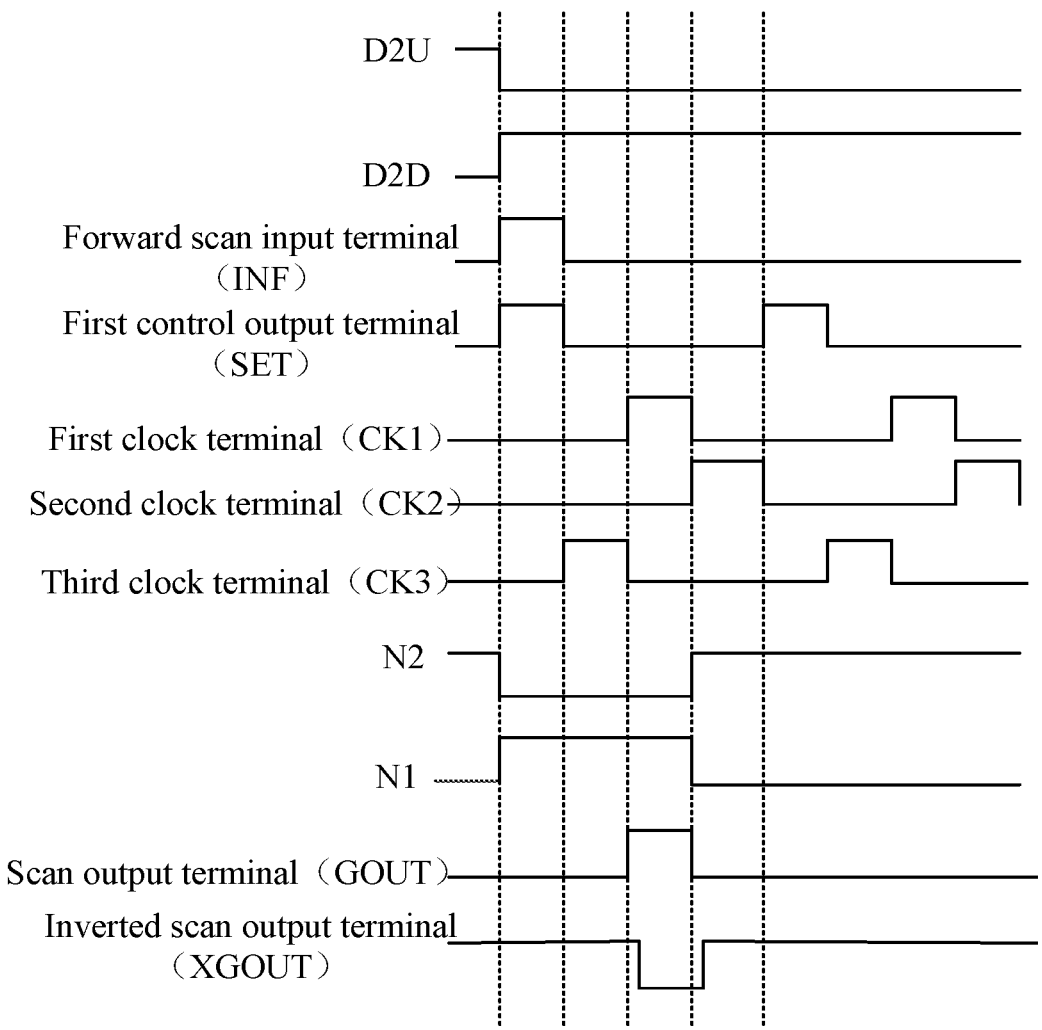
FIG. 11 is a timing diagram of the gate drive unit in FIG. 10.

Exemplarily, FIG. 10 is a schematic diagram of circuit elements of another gate drive unit according to an embodiment of the present application. FIG. 11 is a timing diagram of the gate drive unit in FIG. 10. Referring to FIG. 10, optionally, the shift register unit 111 includes a node control subunit 1111, a node charging subunit 1112, a scan control subunit 1114, an output subunit 1113 and a reset subunit 1115. The node control subunit 1111 is configured to control a level of a signal of a first node N1 to be opposite to a level of a signal of a second node N2 according to the signal of the first node N1 or the signal of the second node N2. The output subunit 1113 is configured to provide a signal of the first clock terminal CK1 of the display panel for the scan output terminal GOUT under the control of the signal of the first node N1, or provide a signal of a first reference voltage terminal VGL of the display panel for the scan output terminal GOUT under the control of the signal of the second node N2. The node charging subunit 1112 is electrically connected to a first control output terminal SET of the display panel, and the node charging subunit 1112 is configured to provide a signal of an input node in for the first node N1 under the control of a signal of the first control output terminal of the display panel. The scan control subunit 1114 is configured to provide a signal of a forward scan input terminal INF of the display panel for the input node in under the control of a signal of a forward scan control terminal U2D of the display panel, or provide a signal of an inverted scan input terminal INB of the display panel for the input node in under the control of a signal of an inverted scan control terminal D2U of the display panel. The reset subunit 1115 is electrically connected to a reset control terminal RST of the display panel, and the reset subunit 1115 is configured to reset a potential of the first node N1 under the control of a signal of the reset control terminal RST of the display panel, and provide a signal of a second reference voltage terminal VGH of the display panel for the second node N2. The inverted unit 112 includes a first inverter R1, an input terminal of the first inverter R1 is electrically connected to the scan output terminal GOUT of the shift register unit 111, and an output terminal of the first inverter R1 is connected to one inverted scan line 22.

In an embodiment, multiple implementations of the node control subunit 1111 exist. Exemplarily, FIG. 10 shows that the node control subunit 1111 includes a first thin film transistor T1, a second thin film transistor T2 and a third thin film transistor T3. A gate of the first thin film transistor T1 is electrically connected to the second node N2. A first electrode of the first thin film transistor T1 is electrically connected to the first reference voltage terminal VGL. A second electrode of the first thin film transistor T1 is electrically connected to the first node N1. A gate of the second thin film transistor T2 is electrically connected to the input node in. A first electrode of the second thin film transistor T2 is electrically connected to the first reference voltage terminal VGL of the display panel. A second electrode of the second thin film transistor T2 is electrically connected to the second node N2. A gate of the third thin film transistor T3 is electrically connected to the first node N1. A first electrode of the third thin film transistor T3 is electrically connected to the first reference voltage terminal VGL of the display panel. A second electrode of the third thin film transistor T3 is electrically connected to the second node N2.

In an embodiment, multiple implementations of the node charging subunit 1112 exist. Exemplarily, FIG. 10 shows that the node charging subunit 1112 includes a fourth thin film transistor T4. A gate of the fourth thin film transistor T4 is electrically connected to the first control terminal SET of the display panel. A first electrode of the fourth thin film transistor T4 is electrically connected to the input node in. A second electrode of the fourth thin film transistor T4 is electrically connected to the first node N1.

In an embodiment, multiple implementations of the output subunit 1113 exist. Exemplarily, FIG. 10 shows that the output subunit 1113 includes a fifth thin film transistor T5, a sixth thin film transistor T6, a first capacitor C1 and a second capacitor C2. A gate of the fifth thin film transistor T5 is electrically connected to the second node N2. A first electrode of the fifth thin film transistor T5 is electrically connected to the first reference voltage terminal VGL of the display panel. A second electrode of the fifth thin film transistor T5 is the scan signal output terminal. A gate of the sixth thin film transistor T6 is electrically connected to the first node N1. A first electrode of the sixth thin film transistor T6 is electrically connected to the first clock terminal CK1. A second electrode of the sixth thin film transistor T6 is electrically connected to the second electrode of the fifth thin film transistor T5. A first electrode of the first capacitor C1 is electrically connected to the first reference voltage terminal VGL of the display panel. A second electrode of the first capacitor C1 is electrically connected to the second node N2. A first electrode of the second capacitor C2 is electrically connected to the first node N1. A second electrode of the second capacitor C2 is electrically connected to the scan output terminal GOUT of the shift register unit 111.

In an embodiment, multiple implementations of the scan control subunit 1114 exist. Exemplarily, FIG. 10 shows that the scan control subunit 1114 includes a seventh thin film transistor T7 and an eighth thin film transistor T8. A gate of the seventh thin film transistor T7 is electrically connected to the forward scan control terminal U2D of the display panel. A first electrode of the seventh thin film transistor T7 is electrically connected to the forward scan input terminal INF of the display panel. A second electrode of the seventh thin film transistor T7 is electrically connected to the input node in. A gate of the eighth thin film transistor T8 is electrically connected to the inverted scan control terminal D2U of the display panel. A first electrode of the eighth thin film transistor T8 is electrically connected to the inverted scan input terminal INB of the display panel. A second electrode of the eighth thin film transistor T8 is electrically connected to the input node in.

In an embodiment, multiple implementations of the reset subunit 1115 exist. Exemplarily, FIG. 10 shows that the reset subunit 1115 includes a ninth thin film transistor T9 and a tenth thin film transistor T10. A gate of the ninth thin film transistor T9 is electrically connected to the reset control terminal RST of the display panel. A first electrode of the ninth thin film transistor T9 is electrically connected to the input node in. A second electrode of the ninth thin film transistor T9 is electrically connected to the first node N1. A gate of the tenth thin film transistor T10 is electrically connected to the reset control terminal RST of the display panel. A first electrode of the tenth thin film transistor T10 is electrically connected to the second reference voltage terminal VGH of the display panel. A second electrode of the tenth thin film transistor T10 is electrically connected to the first node N1.

Optionally, the shift register unit 111 further includes a reset control subunit 1116. The reset control subunit 1116 includes an eleventh thin film transistor T11 and a twelfth thin film transistor T12. A gate of the eleventh thin film transistor T11 is electrically connected to the forward scan control terminal U2D of the display panel. A first electrode of the eleventh thin film transistor T11 is electrically connected to the second clock terminal CK2 of the display panel. A second electrode of the eleventh thin film transistor T11 is electrically connected to the reset control terminal RST of the display panel. A gate of the twelfth thin film transistor T12 is electrically connected to the inverted scan control terminal D2U of the display panel. A first electrode of the twelfth thin film transistor T12 is electrically connected to a third clock terminal CK3 of the display panel. A second electrode of the twelfth thin film transistor T12 is connected to the reset control terminal RST of the display panel.

In an embodiment, the operating process of the shift register unit 111 in the gate drive unit 11 may be understood according to FIG. 10 and FIG. 11, which will not be repeated herein. With continued reference to FIG. 10 and FIG. 11, after the scan output terminal GOUT of the shift register unit 111 outputs the scan signal, the scan signal is input to the input terminal of the inverted unit 112. The signal output by the output terminal of the inverted unit 112 is the signal obtained after one inversion of the signal of the input terminal of the inverted unit 112, that is, the signal output by the output terminal of the inverted unit 112 is opposite to the signal of the input terminal of the inverted unit 112, therefore, the level state of the scan signal is opposite to the level state of the inverted scan signal, and the time delay between the first effective pulse signal and the second effective pulse signal is the time required to pass one inverter R.

Optionally, the time period corresponding to the first effective pulse signal partially overlaps the time period corresponding to the second effective pulse signal, and the start time of the first effective pulse signal is later than the start time of the second effective pulse signal.

Figure 12:
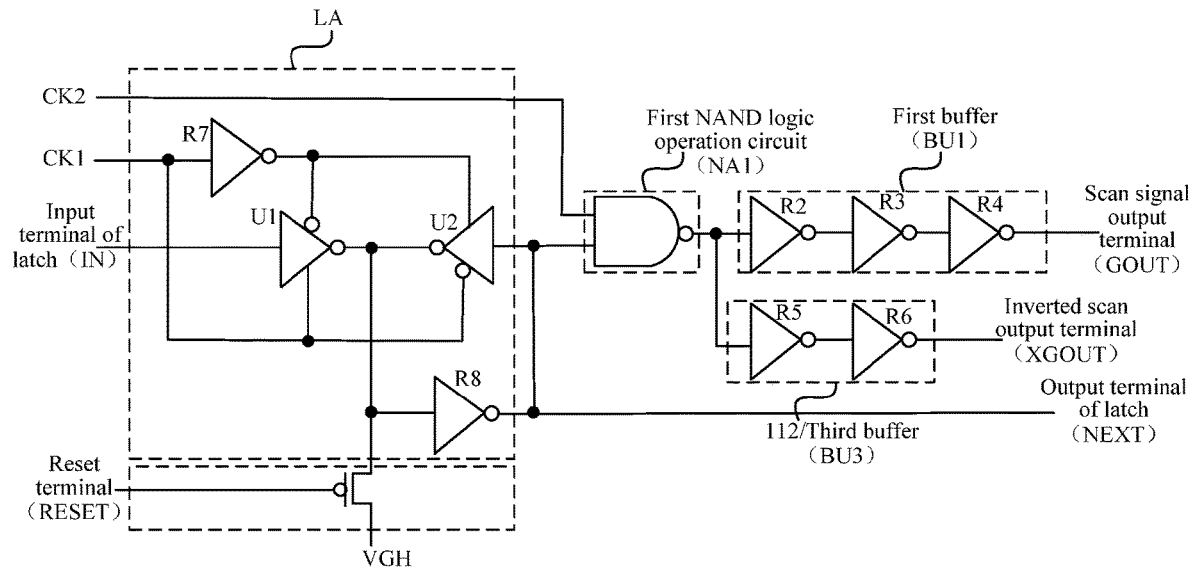
FIG. 12 is a structural diagram of another gate drive unit according to an embodiment of the present application.
Figure 14:
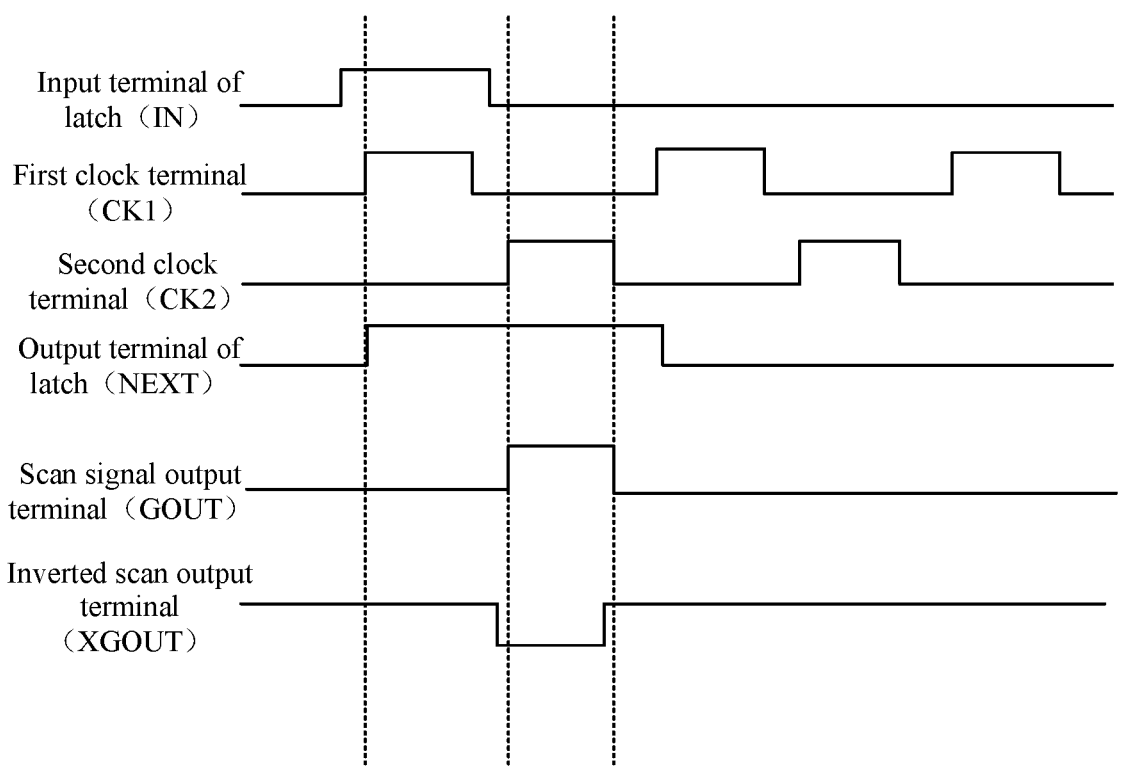
FIG. 14 is a timing diagram of the gate drive unit in FIG. 12 and the gate drive unit in FIG. 13.

Multiple implementations of the gate drive unit 11 exist. Examples will be described below. FIG. 12 is a structural diagram of another gate drive unit according to an embodiment of the present application. FIG. 14 is a timing diagram of the gate drive unit in FIG. 12. Referring to FIG. 12, optionally, the shift register unit 111 includes the latch LA, the first NAND logic operation circuit NA1 and the first buffer BU1. The clock input terminal of the latch LA is electrically connected to the first clock terminal CK1 of the display panel. The input terminal IN of the latch LA is electrically connected to the output terminal NEXT of the latch LA in the upper-stage shift register unit 111. The first input terminal of the first NAND logic operation circuit NA1 is electrically connected to the output terminal NEXT of the latch LA. The second input terminal of the first NAND logic operation circuit NA1 is electrically connected to the second clock terminal CK2 of the display panel. The output terminal of the first NAND logic operation circuit NA1 is electrically connected to the input terminal of the first buffer BU1. The output terminal of the first buffer BU1 is connected to one scan line 21. The inverted unit 112 includes a third buffer BU3. The output terminal of the first NAND logic operation circuit NA1 is electrically connected to an input terminal of the third buffer BU3. An output terminal of the third buffer BU3 is connected to one inverted scan line 22. The first buffer BU1 includes m+1 inverters R connected in series, and the third buffer BU3 includes m inverters R connected in series, where m is a positive integer.

In an embodiment, the first buffer BU1 includes m+1 inverters R, then the signal output by the output terminal of the first buffer BU1 is the signal obtained after m+1 inversions of the signal output by the output terminal of the first NAND logic operation circuit NA1. The third buffer BU3 includes m inverters R, then the signal output by the output terminal of the third buffer BU3 is the signal obtained after m inversions of the signal output by the output terminal of the first NAND logic operation circuit NA1. In this manner, the level state of the scan signal output by the first buffer BU1 is opposite to the level state of the inverted scan signal output by the third buffer BU3, that is, the type of the first effective pulse signal is opposite to the type of the second effective pulse signal. In an embodiment, the first buffer BU1 has one more inverter R than the third buffer BU3, so that the scan signal has a delay relative to the inverted scan signal, that is, the first effective pulse signal partially overlaps the second effective pulse signal, and the start time of the first effective pulse signal is later than the start time of the second effective pulse signal. In an embodiment, FIG. 12 exemplarily shows the case where m is 2, which does not constitute a limitation to the present application. The value of m can be set according to actual conditions.

In an embodiment, compared to the gate drive unit 11 shown in FIG. 5, although the first effective pulse signal output by the gate drive unit 11 shown in FIG. 12 partially overlaps the second effective pulse signal output by the gate drive unit 11 shown in FIG. 12, causing it impossible to completely eliminate the electromagnetic interference generated by the scan signal, the inverted unit 112 includes only the third buffer BU3, has relatively few electronic elements and occupies a relatively small area, thus it is beneficial to achieve a narrow frame.

Figure 13:
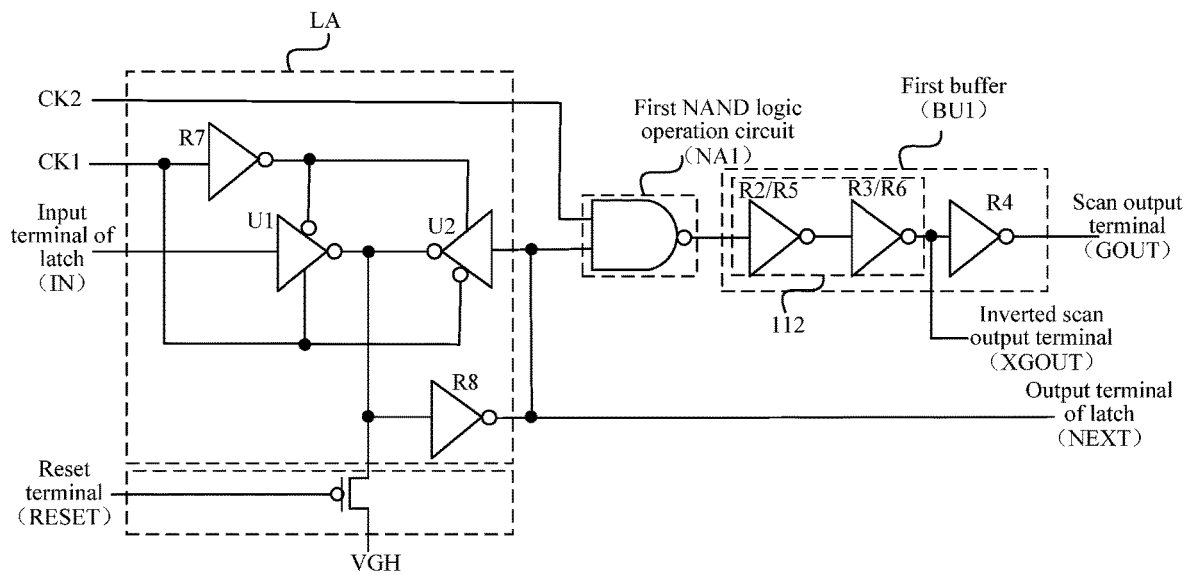
FIG. 13 is a structural diagram of a gate drive unit according to an embodiment of the present application.

FIG. 13 is a structural diagram of a gate drive unit according to an embodiment of the present application. FIG. 14 is a timing diagram of the gate drive unit in FIG. 12 and the gate drive unit in FIG. 13. Optionally, the first buffer BU1 includes a second inverter R2, a third inverter R3 and a fourth inverter R4. An input terminal of the second inverter R2 is electrically connected to the output terminal of the first NAND logic operation circuit NA1. An output terminal of the second inverter R2 is electrically connected to an input terminal of the third inverter R3. An output terminal of the third inverter R3 is electrically connected to an input terminal of the fourth inverter R4. An output terminal of the fourth inverter R4 is connected to one scan line 21. The third buffer BU3 includes a fifth inverter R5 and a sixth inverter R6. An input terminal of the fifth inverter R5 is electrically connected to the output terminal of the first NAND logic operation circuit NA1. An output terminal of the fifth inverter R5 is electrically connected to an input terminal of the sixth inverter R6. An output terminal of the sixth inverter R6 is connected to one inverted scan line 22. The second inverter R2 is multiplexed as the fifth inverter R5, and the third inverter R3 is multiplexed as the sixth inverter R6.

In an embodiment, with respect to the gate drive circuit 10 shown in FIG. 12, the third buffer BU3 is formed by multiplexing a part of the inverters R in the first buffer BU1, such that the number of electronic elements in the gate drive unit 11 can be reduced, and the area occupied by the gate drive unit 11 can be reduced, which is beneficial to achieve a narrow frame.

Referring to FIGS. 12 to 14, the operating process of the gate drive unit 11 is as follows: after the signal output by the output terminal NEXT of the latch LA and the signal of the second clock terminal CK2 of the display panel are subjected to an NAND operation, these two signals are subjected to voltage stabilization performed by the first buffer BU1 and are output after three inversions, then the scan signal is obtained. After the signal output by the output terminal of the latch LA and the signal of the second clock terminal CK2 of the display panel are subjected to an NAND operation, these two signals are subjected to voltage stabilization performed by the second buffer BU2 and are output after two inversions, then the inverted scan signal is obtained.

Based on the preceding technical scheme, with continued reference to FIG. 3, optionally, the inverted scan line 22 is floating.

In an embodiment, the floating mentioned here means that the inverted scan line 22 is introduced into the display area AA, and the inverted scan line 22 is not electrically connected to the subpixel drive circuit 41 in the display area AA. In this manner, the subpixel drive circuit 41 is not required to be improved, and the process can be simplified.

Figure 15:
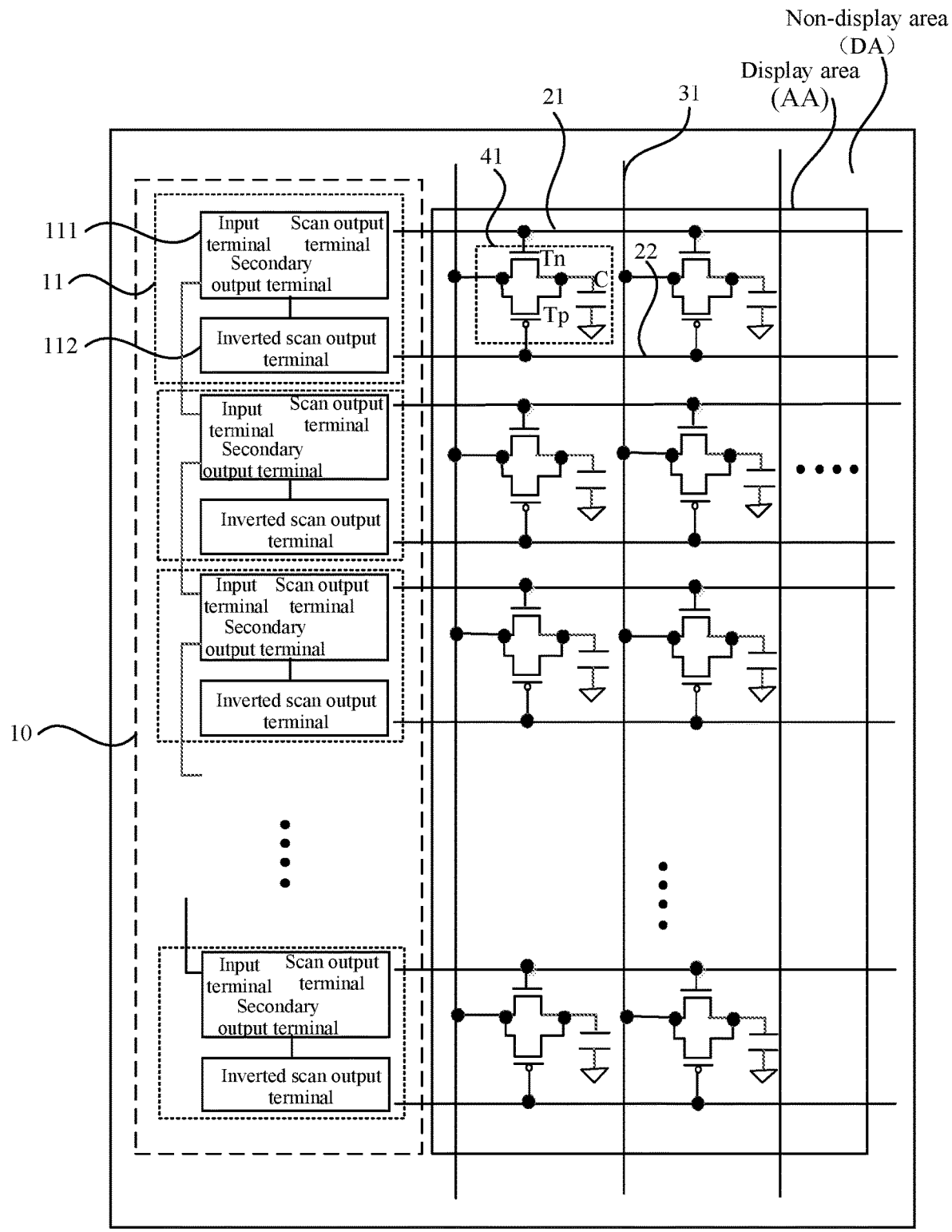
FIG. 15 is a structural diagram of another display panel according to an embodiment of the present application.

Based on the preceding technical scheme, FIG. 15 is a structural diagram of another display panel according to an embodiment of the present application. Referring to FIG. 15, optionally, the display panel further includes multiple data lines 31. The data lines 31 and the scan lines 21 are intersected. The multiple data lines 31 and the multiple scan lines 21 intersect to define multiple subpixel areas. The subpixel areas are provided with subpixel drive circuits 41. Each subpixel drive circuit 41 includes a scan signal input terminal and an inverted signal input terminal, the scan signal input terminal is electrically connected to a respective scan line 21, and the inverted signal input terminal is electrically connected to a respective inverted scan line 22.

In an embodiment, the display panel may be an LCD panel, an OLED display panel or other types of display panels. Correspondingly, the subpixel drive circuit 41 may be a subpixel drive circuit 41 in the LCD panel, a subpixel drive circuit 41 in the OLED display panel or subpixel drive circuits 41 in other types of display panels. The subpixel drive circuits 41 in different types of display panels are different. Multiple implementations for the subpixel drive circuit 41 in the same type of display panels exist, which are not listed here. The subpixel drive circuit 41 in the LCD display panel is used as an example for description below.

With continued reference to FIG. 15, optionally, the subpixel drive circuit 41 includes an N-type thin film transistor Tn, a P-type thin film transistor Tp and a capacitor C. A control terminal of the N-type thin film transistor Tn is electrically connected to one scan line 21. A first electrode of the N-type thin film transistor Tn is electrically connected to one data line 31. A second electrode of the N-type thin film transistor Tn is electrically connected to a first electrode plate of the capacitor C. A second electrode plate of the capacitor C is electrically connected to a fixed voltage terminal (such as a common voltage signal terminal). A control terminal of the P-type thin film transistor Tp is electrically connected to the inverted scan line. A first electrode of the P-type thin film transistor Tp is electrically connected to the first electrode of the N-type thin film transistor Tn. A second electrode of the P-type thin film transistor Tp is electrically connected to the second electrode of the N-type thin film transistor Tn. For ease of drawing, the electronic elements in only one of the subpixel drive circuits 41 are marked with reference numerals, and the electronic elements in other subpixel drive circuits 41 may be understood accordingly.

In an embodiment, in the display panel shown in FIG. 15, while the first effective pulse signal drives the N-type thin film transistor Tn to turn on, the second effective pulse signal can drive the P-type thin film transistor Tp to turn on. In this case, the on-impedance is the parallel impedance of the N-type thin film transistor Tn and the P-type thin film transistor. The parallel impedance is less than the impedance of a single N-type thin film transistor Tn. In this manner, the driving capability of the data signal on the data line 31 can be enhanced, and the on-time of the data signal can be reduced.

Based on the preceding technical scheme, optionally, the scan line 21 and the inverted scan line 22, which are connected to the same gate drive unit 11, are located between two adjacent rows of subpixel units. The advantage of this setting is that the scan line 21 and the inverted scan line 22 which are connected to the same gate drive unit 11 are relatively close to each other, so that for the interfered electronic device, the received electromagnetic radiation generated by the scan signal and the received electromagnetic radiation generated by the inverted scan signal can be approximately regarded as being emitted from the same position. In other words, the vector direction of the electromagnetic radiation generated by the scan signal and the vector direction of the electromagnetic radiation generated by the inverted scan signal differ by approximately 180°, which is beneficial to the mutual cancel between the electromagnetic radiation generated by the scan signal and the electromagnetic radiation generated by the inverted scan signal. In this manner, the electromagnetic interference generated by the scan signal can be weakened to a relatively great extent.

Based on the preceding technical scheme, optionally, the scan line 21 and the inverted scan line 22 are located in the same metal layer. The advantage of this setting is that it is conducive to reducing the distance between the scan line 21 and the inverted scan line 22 which are connected to the same gate drive unit 11, so that for the interfered electronic device, the received electromagnetic radiation generated by the scan signal and the received electromagnetic radiation generated by the inverted scan signal can be approximately regarded as being emitted from the same position, which is beneficial to weaken the electromagnetic interference generated by the scan signal to a relatively great extent.

Based on the preceding technical scheme, optionally, the line width of the scan line 21 is the same as the line width of the inverted scan line 22, and the length of the scan line 21 is the same as the length of the inverted scan lines 22. In the present application, the line width and length of the scan line 21 are the same as the line width and length of the inverted scan line 22 respectively, so that the identity of the physical structures of the two electromagnetic interference radiation sources can be ensured, and thus the area covered by the electromagnetic radiation generated by the scan signal is consistent with the area covered by the electromagnetic radiation generated by the inverted scan signal. In this manner, for the interfered electronic device, theoretically, the received electromagnetic radiation generated by the scan signal has the same amplitude as the received electromagnetic radiation generated by the inverted scan signal.

Figure 16:
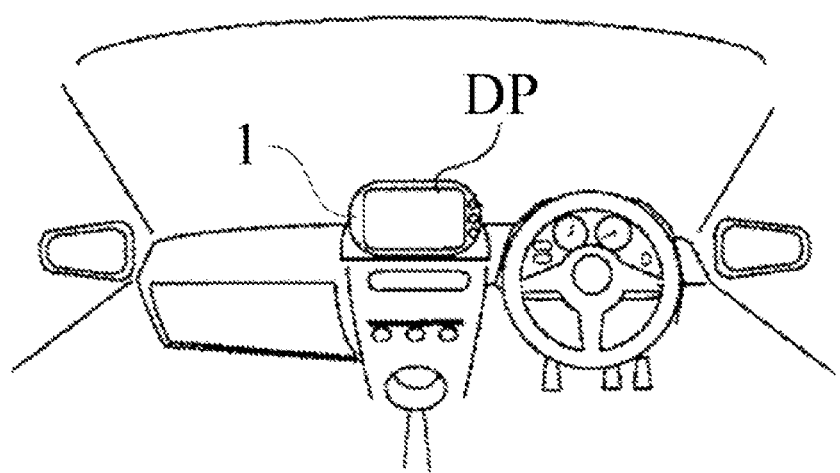
FIG. 16 is a structural diagram of a display device according to an embodiment of the present application.

An embodiment of the present application further provides a display device. The display device includes any one of the display panels described in the embodiments of the present application. Therefore, the display device has corresponding functions and beneficial effects, which will not be repeated herein. In an embodiment, the display device may be an electronic display device such as a vehicle-mounted display screen, a mobile phone, a computer or a television, which is not limited in the present application. In the case where the display device is used as a vehicle-mounted display screen, the display panel can be applied to cars, ships, airplanes, etc. FIG. 16 is a structural diagram of a display device according to an embodiment of the present application. The display device includes any one of the display panels (DPs) described in the embodiments of the present application. The display device is applied to a car and can be an inherent structure independent of the car as shown in FIG. 16. The display device can also be integrated with other structures in the car. For example, the display device can be integrated with the front windshield or integrated with the countertop around the dashboard. No limitation is made in the present application.

What is claimed is:

1. A display panel, comprising: a gate drive circuit, a plurality of scan lines and a plurality of inverted scan lines;
    wherein the plurality of inverted scan lines is disposed in parallel with the plurality of scan lines;
    wherein the gate drive circuit comprises a plurality of cascaded gate drive units, and each of the plurality of gate drive units comprises a shift register unit and an inverted unit;
    wherein in a same one of the plurality of gate drive units, the inverted unit is electrically connected to the shift register unit, a scan output terminal of the shift register unit is electrically connected to one of the pluralities of scan lines, and an inverted scan output terminal of the inverted unit is electrically connected to one of the plurality of inverted scan lines;
    wherein the scan output terminal of the shift register unit outputs a first effective pulse signal, and the inverted scan output terminal of the inverted unit outputs a second effective pulse signal;
    wherein a time period corresponding to the first effective pulse signal completely overlaps a time period corresponding to the second effective pulse signal, and a level state of the first effective pulse signal is opposite to a level state of the second effective pulse signal;
    wherein the shift register unit comprises: a latch, a first NAND logic operation circuit and a first buffer; wherein a clock input terminal of the latch is electrically connected to a first clock terminal of the display panel, and an input terminal of the latch is electrically connected to an output terminal of a latch in an upper-stage shift register unit of the shift register unit;
    wherein a first input terminal of the first NAND logic operation circuit is electrically connected to an output terminal of the latch, a second input terminal of the first NAND logic operation circuit is electrically connected to a second clock terminal of the display panel, an output terminal of the first NAND logic operation circuit is electrically connected to an input terminal of the first buffer, and an output terminal of the first buffer is connected to the one of the plurality of scan lines;
    wherein the inverted unit comprises a first AND logic operation circuit and a second buffer, wherein a first input terminal of the first AND logic operation circuit is electrically connected to the output terminal of the latch, a second input terminal of the first AND logic operation circuit is electrically connected to the second clock terminal of the display panel, an output terminal of the first AND logic operation circuit is electrically connected to an input terminal of the second buffer, and an output terminal of the second buffer is connected to the one of the plurality of inverted scan lines; and
    wherein the first buffer and the second buffer each comprises m inverters connected in series, wherein m is a positive integer.

2. The display panel of claim 1, wherein the plurality of inverted scan lines is floating.

3. The display panel of claim 1, further comprising a plurality of data lines, wherein the plurality of data lines and the plurality of scan lines are intersected, and the plurality of data lines and the plurality of scan lines intersect to define a plurality of subpixel areas, and the plurality of subpixel areas are provided with subpixel drive circuits; and wherein each of the subpixel drive circuits comprises a scan signal input terminal and an inverted signal input terminal, the scan signal input terminal is electrically connected to a respective one of the plurality of scan lines, and the inverted signal input terminal is electrically connected to a respective one of the plurality of inverted scan lines.

4. The display panel of claim 3, wherein each of the subpixel drive circuits comprises an N-type thin film transistor, a P-type thin film transistor and a capacitor;

wherein a control terminal of the N-type thin film transistor is electrically connected to the respective one of the plurality of scan lines, a first electrode of the N-type thin film transistor is electrically connected to a respective one of the plurality of data lines, a second electrode of the N-type thin film transistor is electrically connected to a first electrode plate of the capacitor, and a second electrode plate of the capacitor is electrically connected to a fixed voltage terminal; and wherein a control terminal of the P-type thin film transistor is electrically connected to the respective one of the plurality of inverted scan lines, a first electrode of the P-type thin film transistor is electrically connected to the first electrode of the N-type thin film transistor, and a second electrode of the P-type thin film transistor is electrically connected to the second electrode of the N-type thin film transistor.

5. The display panel of claim 1, wherein the one of the plurality of scan lines and the one of the plurality of inverted scan lines, which are connected to the same one of the plurality of gate drive units, are located between two adjacent rows of subpixel units.

6. The display panel of claim 1, wherein the plurality of scan lines and the plurality of inverted scan lines are located in a same metal layer.

7. The display panel of claim 1, wherein a line width of each of the plurality of scan lines is the same as a line width of each of the plurality of inverted scan lines, and a length of each of the plurality of scan lines is the same as a length of each of the plurality of inverted scan lines.

8. A display device, comprising a display panel wherein the display panel comprises: a gate drive circuit, a plurality of scan lines and a plurality of inverted scan lines;

wherein the plurality of inverted scan lines is disposed in parallel with the plurality of scan lines;

wherein the gate drive circuit comprises a plurality of cascaded gate drive units, and each of the plurality of gate drive units comprises a shift register unit and an inverted unit;

wherein in a same one of the plurality of gate drive units, the inverted unit is electrically connected to the shift register unit, a scan output terminal of the shift register unit is electrically connected to one of the plurality of scan lines, and an inverted scan output terminal of the inverted unit is electrically connected to one of the plurality of inverted scan lines;

wherein the scan output terminal of the shift register unit outputs a first effective pulse signal, and the inverted scan output terminal of the inverted unit outputs a second effective pulse signal;

wherein a time period corresponding to the first effective pulse signal completely overlaps a time period corresponding to the second effective pulse signal, and a level state of the first effective pulse signal is opposite to a level state of the second effective pulse signal;

wherein the shift register unit comprises: a latch, a first NAND logic operation circuit and a first buffer; wherein a clock input terminal of the latch is electrically connected to a first clock terminal of the display panel, and an input terminal of the latch is electrically connected to an output terminal of a latch in an upper-stage shift register unit of the shift register unit;

wherein a first input terminal of the first NAND logic operation circuit is electrically connected to an output terminal of the latch, a second input terminal of the first NAND logic operation circuit is electrically connected to a second clock terminal of the display panel, an output terminal of the first NAND logic operation circuit is electrically connected to an input terminal of the first buffer, and an output terminal of the first buffer is connected to the one of the plurality of scan lines;

wherein the inverted unit comprises a first AND logic operation circuit and a second buffer, wherein a first input terminal of the first AND logic operation circuit is electrically connected to the output terminal of the latch, a second input terminal of the first AND logic operation circuit is electrically connected to the second clock terminal of the display panel, an output terminal of the first AND logic operation circuit is electrically connected to an input terminal of the second buffer, and an output terminal of the second buffer is connected to the one of the plurality of inverted scan lines; and wherein the first buffer and the second buffer each comprises m inverters connected in series, wherein m is a positive integer.

9. The display device of claim 8, wherein the plurality of inverted scan lines is floating.

10. The display device of claim 8, further comprising a plurality of data lines, wherein the plurality of data lines and the plurality of scan lines are intersected, and the plurality of data lines and the plurality of scan lines intersect to define a plurality of subpixel areas, and the plurality of subpixel areas are provided with subpixel drive circuits; and wherein each of the subpixel drive circuits comprises a scan signal input terminal and an inverted signal input terminal, the scan signal input terminal is electrically connected to a respective one of the plurality of scan lines, and the inverted signal input terminal is electrically connected to a respective one of the plurality of inverted scan lines.

11. The display device of claim 10, wherein each of the subpixel drive circuits comprises an N-type thin film transistor, a P-type thin film transistor and a capacitor;

wherein a control terminal of the N-type thin film transistor is electrically connected to the respective one of the plurality of scan lines, a first electrode of the N-type thin film transistor is electrically connected to a respective one of the plurality of data lines, a second electrode of the N-type thin film transistor is electrically connected to a first electrode plate of the capacitor, and a second electrode plate of the capacitor is electrically connected to a fixed voltage terminal; and wherein a control terminal of the P-type thin film transistor is electrically connected to the respective one of the plurality of inverted scan lines, a first electrode of the P-type thin film transistor is electrically connected to the first electrode of the N-type thin film transistor, and a second electrode of the P-type thin film transistor is electrically connected to the second electrode of the N-type thin film transistor.

12. The display device of claim 8, wherein the one of the plurality of scan lines and the one of the plurality of inverted scan lines, which are connected to the same one of the plurality of gate drive units, are located between two adjacent rows of subpixel units.

13. The display device of claim 8, wherein the plurality of scan lines and the plurality of inverted scan lines are located in a same metal layer.

14. The display device of claim 8, wherein a line width of each of the plurality of scan lines is the same as a line width of each of the plurality of inverted scan lines, and a length of each of the plurality of scan lines is the same as a length of each of the plurality of inverted scan lines.

* * * * *